United States Patent
Bohannan et al.

(10) Patent No.: US 10,644,736 B1
(45) Date of Patent: May 5, 2020

(54) SYSTEM AND METHOD FOR SPURIOUS SIGNAL DETECTION AND REJECTION

(71) Applicant: BAE SYSTEMS INFORMATION AND ELECTRONIC SYSTEMS INTEGRATION INC., Nashua, NH (US)

(72) Inventors: Randall M. Bohannan, Merrimack, NH (US); Gregory S. Laste, Hudson, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 16/213,644

(22) Filed: Dec. 7, 2018

(51) Int. Cl.
*H04B 1/10* (2006.01)
*H03F 1/32* (2006.01)

(52) U.S. Cl.
CPC ......... *H04B 1/1036* (2013.01); *H03F 1/3211* (2013.01); *H03F 2200/372* (2013.01); *H03F 2200/451* (2013.01)

(58) Field of Classification Search
CPC ................. H04B 1/1036; H03F 1/3211; H03F 2200/372; H03F 2200/451
See application file for complete search history.

(56) References Cited

U.S. PATENT DOCUMENTS 8,422,971 B2 * 4/2013 Su ........................ H03G 3/3052
455/232.1
9,057,772 B1 * 6/2015 Chavez ................. G01S 5/0215

* cited by examiner

*Primary Examiner* — Vineeta S Panwalkar
(74) *Attorney, Agent, or Firm* — Sand, Sebolt & Wernow LPA (57) ABSTRACT

An amplifier generate harmonic noise or nuisance signals when the amplifier enters into a nonlinear amplification event. The harmonic noise or nuisance signals are spurious and a tagging circuit may tag them as such so they bypass signal processing logic and provide the same to a downstream hardware device that skips the signals tagged as spurious. The system uses a spurious signal detector and a comparator to identify nonlinear amplification events containing harmonic noise below an amplitude threshold that indicates the harmonic noise or nuisance signals as spurious to the downstream hardware device. Typically, the system is incorporated into an electronic warfare system such that the downstream hardware device effectuates countermeasures for a manned or unmanned platform.

20 Claims, 3 Drawing Sheets

SYSTEM AND METHOD FOR SPURIOUS
SIGNAL DETECTION AND REJECTION

TECHNICAL FIELD

The present disclosure relates generally to spurious signal detection and rejection. More particularly, the present disclosure relates to a signal detection assembly that utilizes time envelopes defined by a leading edge and a trailing edge of a nonlinear amplification event.

BACKGROUND

Background Information

Signal sources generate signals either inadvertently or purposefully. A receiver is an electrical device configured to receive the signals. Typically, receivers include electrical circuitry to amplify the signals that the receiver receives. Nonlinearity is behavior of an electrical circuit, particularly an amplifier, in which the output signal strength does not vary in direct linear proportion to the input signal strength (i.e., it amplifies in a nonlinear manner). In a nonlinear amplification device, the output-to-input amplitude ratio (also called the gain) depends on the strength of the input signal. In an amplifier that exhibits nonlinearity, some portion of the output-versus-input signal amplitude graph appear as a curved line over part or all of the input amplitude range. During nonlinear amplification events, the amplifier generates noise that manifests as harmonic signals. The harmonic signals are noise that can disturb downstream hardware devices that use the signal to perform another function. One exemplary downstream use is a portion of electronic warfare (EW) systems that use the signals to perform various functions, such as countermeasures by a platform.

SUMMARY

Issues continue to exist with current signal processing efforts inasmuch as they often require significant signal processing efforts and techniques to account for the harmonic signals (i.e., noise) that are spurious to the operation of downstream hardware devices. Thus, it is desirable to provide an improved signal processing system that can reduce signal processing efforts to free up the signal processing to perform other functions and thereby increase efficiency. For example, in EW systems, it is advantageous to free up the processing efforts so that the processors can assist with more detailed countermeasure efforts. The present disclosure addresses these and other issues by providing a signal detection assembly having a signal detector or spur detector coupled with a receiver to evaluate time envelopes defined from a leading edge to a trailing edge of a nonlinear amplification event. A tagging circuit can tag the signal as spurious if the harmonic signals during the time envelop fail to meet an amplification threshold.

In accordance with one aspect, an exemplary embodiment of the present disclosure may include a signal detector (i.e., a spur detector) that determines when a receiver is driven into a nonlinear operating region and performs precise measurements to detect a leading edge and a trailing edge of the nonlinear event to create an envelope. A tagging circuit receives the leading and trailing times via the envelope from the detector. The tagging circuit then compares the leading and trailing edges of any pulses coming from the detector and tags the same as spurious provided that the amplitude of these pulses is below a threshold. If the pulses are tagged as spurious, then the system bypasses downstream processing techniques for the spurious tagged pulse.

In one aspect, an exemplary embodiment of the present disclosure may provide a spurious signal detection assembly comprising: a receiver having a radio frequency (RF) amplifier operative to receive a signal of interest; a spur detector in operative communication with the receiver operative to detect nonlinear amplification events of the signal of interest, wherein the RF amplifier generates harmonic signals during the nonlinear amplification event; a time envelope, generated by the spur detector, that extends from a leading edge of a nonlinear amplification event to a trailing edge of the nonlinear amplification event; a comparator to compare the time envelope with a corresponding time period of the signal of interest received by the receiver and a tagging circuit operative to tag the harmonic signals during nonlinear amplification events as a spurious signal when the comparator determines that the time envelope matches the corresponding time period of the signal of interest and the harmonic signals are below an amplitude threshold; wherein if the tagging circuit tags the harmonic signal as the spurious signal, then the spurious signal bypasses downstream signal processing logic to improve throughput, and if the tagging circuit does not tag the harmonic signal as the spurious signal, then the downstream signal processing logic processes the signal of interest within the time envelope. This exemplary embodiment or another exemplary embodiment may further provide wherein the spur detector is a field programmable gate array (FPGA). This exemplary embodiment or another exemplary embodiment may further provide a first frequency band detection range associated with the of the spur detector; a second frequency band detection range associated with the receiver; wherein the first frequency band detection range is greater than the second frequency band detection range. This exemplary embodiment or another exemplary embodiment may further provide wherein the first frequency band detection range is an entire band of interest that is accomplished by the FPGA with spur detection code. This exemplary embodiment or another exemplary embodiment may further provide wherein the spur detection code mimics a detection approach of a high sensitivity receiver through time alignment of the time envelope from the spur detector with the corresponding time period of the signal of interest in the receiver. This exemplary embodiment or another exemplary embodiment may further provide wherein the spur detection code detects half voltage crossings of leading edge and trailing edge of the signal of interest.

In another aspect, an exemplary embodiment of the present disclosure may provide a method comprising: determining, by a spurious (spur) signal detector, whether a signal amplified by an amplifier drives the amplifier into a nonlinear operating region during an amplification event; wherein if the amplifier is not in the nonlinear operating region of the amplification event, then processing the signal in signal processing logic and providing the signal to a downstream hardware device; wherein if the amplifier is in the nonlinear operating region of the amplification event, then: defining a time envelope from a leading edge to a trailing edge of the amplification event; determining the time of the leading edge and the trailing edge of the time envelope; comparing, in a comparator, the time envelope with the signal as received by a receiver coupled to the spur signal detector for a corresponding time period as the time envelope; tagging, with a tagging circuit coupled to the comparator, the signal as a spurious tagged signal in response to the time envelope matching the signal received by the receiver with the time envelope; and bypassing the signal processing logic and transmitting the spurious tagged signal directly to a downstream hardware device. This exemplary method or another exemplary method may further provide time aligning the time envelope with the signal as received by the receiver prior to comparing the time envelope with the signal. This exemplary method or another exemplary method may further provide identifying, by the spur signal detector, harmonic noise during the nonlinear amplification event; determining, by the comparator, an amplitude associated with the harmonic noise relative to an amplitude threshold, wherein if the amplitude exceeds the amplitude threshold, then processing the signal in signal processing logic and providing the signal to the downstream hardware device; and wherein if the amplitude fails to meet the amplitude threshold, then tagging the signal as the spurious tagged signal and bypassing the signal processing logic. This exemplary method or another exemplary method may further provide receiving, at the receiver, the signal subject to environmental conditions that operatively reduce an ability of an electronic warfare (EW) system from moving into a more efficient operating range, and wherein the spur signal detector, the comparator, and the tagging circuit are adapted to reduce processing of spurious signals when the EW system cannot move into a more efficient operating range based on observational requirements of the EW system This exemplary method or another exemplary method may further provide increasing signal throughput, as compared to processing all portions of the signals in the signal processing logic, by bypassing the spurious tagged signals directly to the downstream hardware device. This exemplary method or another exemplary method may further provide reducing false positives in the signal as observed by the downstream hardware device. This exemplary method or another exemplary method may further provide reducing software loading in the signal processing logic to enable the signal processing logic to have greater software processing abilities for other aspects of an electronic warfare (EW) system.

In yet another aspect, an exemplary embodiment of the present disclosure may provide a system comprising: a signal source generating a signal of interest; a receiver in operative communication with the signal source to receive the signal of interest, wherein the signal effectuates a receiver operation; an amplifier in the receiver to amplify the signal of interest and incidentally generate harmonic signals in response to the amplifier being driven into at least one nonlinear amplification event of the signal of interest, wherein each nonlinear event includes a leading edge and a trailing edge; a spurious (spur) signal detector in operative communication with the receiver and the amplifier to detect the leading edge and the trailing edge of the nonlinear amplification event and operative to generate a time envelope that brackets the nonlinear amplification event from the leading edge to the trailing edge; a comparator in operative communication with the spur signal detector that compares the time envelope with the signal of interest in a corresponding time period to determine whether harmonic signals in the time envelope are spurious during the corresponding signal of interest based on an amplitude threshold; a tagging circuit coupled to the comparator that is operative to tag the nonlinear amplification events as spurious in response to the a determination of the harmonic signals relative to the threshold value; signal processing logic downstream from the receiver; a hardware device downstream from the signal processing logic; wherein if the tagging circuit tags the nonlinear amplification events as spurious, then the signal of interest is directed directly from the receiver to the hardware device and not to the signal processing logic; and wherein if the tagging circuit does not tag an event as spurious, then the signal of interest is directed directly from the receiver to the signal processing logic for further processing. This exemplary embodiment or another exemplary embodiment may further provide the signal having linear events in addition to the non-liner events, wherein the leading edge of the nonlinear event begins at an end of one linear event. This exemplary embodiment or another exemplary embodiment may further provide wherein the linear events represent non-spurious signal periods. This exemplary embodiment or another exemplary embodiment may further provide a direct connection between the receiver and the hardware device effectuating the signal to bypass the signal processing logic when the tagging circuit tags the nonlinear events in the signal. This exemplary embodiment or another exemplary embodiment may further provide the system that is free of a program that generates a pulse report identifying tagged spurious signals to be processed by the signal processing logic. This exemplary embodiment or another exemplary embodiment may further provide wherein the tagging circuit is part of the signal detector. This exemplary embodiment or another exemplary embodiment may further provide wherein the tagging circuit is distinct from the signal detector.

BRIEF DESCRIPTION OF THE SEVERAL VIEWS OF THE DRAWINGS

Sample embodiments of the present disclosure are set forth in the following description, are shown in the drawings and are particularly and distinctly pointed out and set forth in the appended claims.

Similar numbers refer to similar parts throughout the drawings.

DETAILED DESCRIPTION

Figure 1:
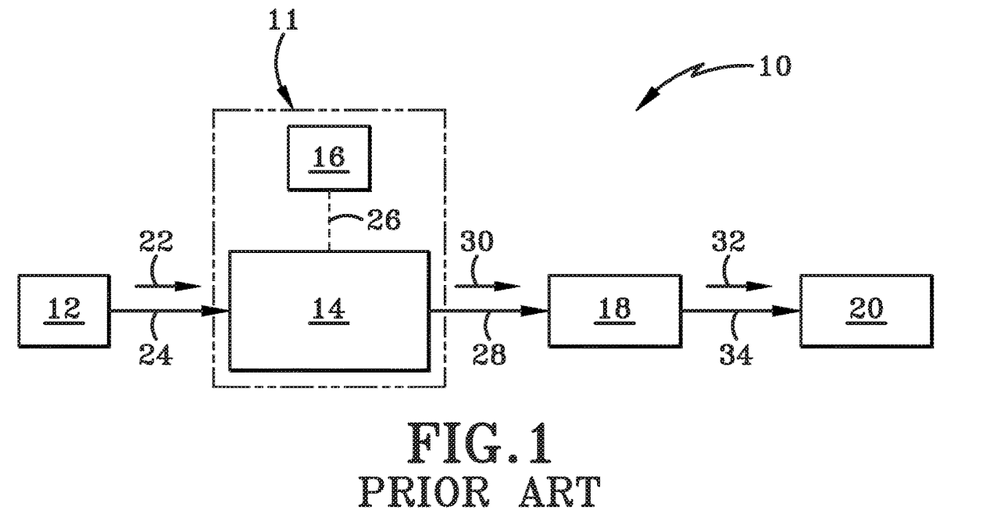
FIG. 1 is a schematic of a conventional signal detection system.

FIG. 1 depicts a conventional or prior art signal detection system is shown generally at 10. The typical conventional signal detection system 10 includes a signal source 12, a signal detection assembly 11 having a receiver 14 and a pulse report generator 16, signal processing logic 18, and a hardware device 20. Components of the signal detection system 10 are arranged in a manner such that signals move in a downstream direction from the signal source 12 to the downstream hardware device 20. As such, portions of the signal detection system 10 may be made with reference as being positioned upstream or downstream relative to other components of the signal detection system 10.

For example, signal source 12 generates a signal 22 that travels along a link 24 between the signal source 12 and the receiver 14 within detection assembly 11. The link may be any wired or wireless communication link effectuating the transmission of the signal 22. Signal 22 may be a signal of interest that the receiver 14 desires to receive. Thus, the receiver 14 is considered downstream from the signal source 12. The pulse report generator 16 of the detection assembly 11 is coupled to the receiver 14 via link 26. Portions of the signal 22 are interpreted and analyzed by the pulse report generator 16. More particularly, the pulse report generator 16 is configured to evaluate pulses in the signal 22 moving through the receiver 14. The pulse report generator 16 identifies portions of the signal 22 that may include noise or other nuisance portions of the signal 22 and generate a pulse report identifying the same. The detection assembly 11, namely the receiver 14, is connected with the signal processing logic 18 via link 28. Link 28 may be any wired or wireless communication link that sends the signal and the pulse report generated by the pulse report generator 16 from the receiver 14 to the signal processing logic 18. The signal and the associated pulse report output from the receiver 14 along link 28 are collectively identified as signal/report 30. The signal processing logic 18 evaluates the signal/report 30 to identify and perform calculations that may either filter or identify nuisance signals or noise signals present in the signal of interest 22. The processing logic 18 may perform calculations to remove the nuisance or noise elements or portions of the signal of interest to generate a filtered signal 32 that is sent from the signal processing logic 18 to the downstream hardware device 20 along link 34. The downstream hardware device 20 may utilize the filtered signal 32 as one having ordinary skill in the art would understand. In some implementations, signal detection system 10 is used as part of an electronic warfare (EW) system on a platform. The platform may be any manned or unmanned vehicle that needs to take advantage of an EW system, for example a countermeasure system.

One exemplary issue with the conventional signal detection system 10 is that the pulse report generator 16 coupled with the receiver 14 that create the signal/report 30 to be evaluated by the signal processing logic 18 creates a significant burden or onus on the signal processing logic 18. When the signal detection system 10 is used in an EW system, it is often desirable to reduce processing requirements as much as possible because the safety of the platform depends on the downstream device 20 receiving and executing the filtered signal 32 as quickly as possible. For example, the downstream hardware device 20 may be part of a countermeasure system that needs to receive the filtered signal in order to execute countermeasures from the platform to intercept a threat. Towards this end, any aspect of the signal detection system 10 that can be made faster or otherwise reduce false alarms simultaneously decreasing the amount of processing needed in the overall signal detection system 10 is advantageous.

Figure 2:
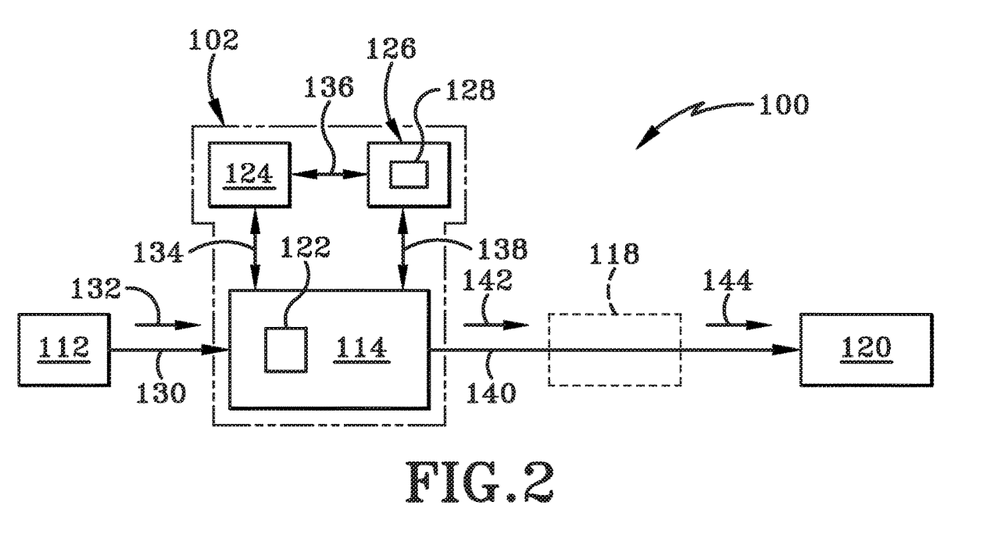
FIG. 2 is a schematic of a signal detection system of the present disclosure.

FIG. 2 depicts a signal detection system in accordance with the present disclosure generally at 100. The signal detection assembly 100, in accordance with one aspect of the present disclosure, is configured to improve the throughput of excess signals that are not needed to be compared and evaluated by the conventional signal processing techniques (i.e., signal processing logic 18) so as to reduce the amount of time and processing effort needed for the signal detection system 10 and the signal detection assembly 11.

The signal detection system 100 of the present disclosure includes a signal detection assembly 102, a signal source 112, a receiver 114 that is part of the signal detection assembly 102, a signal processing logic 18, and a downstream hardware device 120. The signal detection assembly 102, in addition to the receiver 114, further includes an amplifier 122, a spurious signal (spur) detector 124, a comparator 126, and a tagging circuit 128.

The signal source 112 is positioned upstream from the signal detection assembly 102 and may be coupled with the receiver 114 via a link 130. Link 130 may be any wireless or wired link that effectuates the transmission of signals from the signal source 12 to the receiver 114. Signal source 112 may be any electronic device that generates the signal for transmission through any medium, such as link 130. Signal source 112 may be hostile to the platform carrying the signal detection system 100. However, signal detection system 100 is equally operable with the signal source 112 that is a communication device transmitting friendly signals to the platform carrying the signal detection assembly 102. Accordingly, signal source 112 may be any type of signal generator. For example, signal source 112 may be a purposeful signal generator or may be a signal source that incidentally generates signals that are to be received and detected by the signal detection assembly 102, namely, the receiver 114. In a further embodiment, the signal source 112 generates radio frequency (RF) signals. The RF signals transmitted from the signal source 112 to the signal detection assembly 102, namely the receiver 114, along link 130 is shown as signal 132. The signal 132 may be considered a signal of interest that the signal detection assembly 102 needs to detect and determine how it should be ultimately provided to the downstream hardware device 120, wherein how the assembly 102 provides the signal 132 to the downstream hardware device 120 is described in greater detail below.

Signal detection assembly 102 is operative and configured to receive the signal of interest or signal 132 at the receiver 114. As is often the case, the receiver 114 includes the amplifier 122. When the signal of interest 132 is an RF signal, then the amplifier 122 is an RF amplifier. The RF amplifier 122 within the receiver 114 is an electronic amplifier 122 that converts low power radio frequency signals (i.e., signal 132) into a higher power signal. Typically, the RF power amplifier 122 is the first or close to the first electronic device that the signal 132 travels through in the receiver 114. With respect to the present disclosure, the amplifier 122 may operate in any different mode, often referred to as classes, to help achieve different design goals of the signal detection assembly 102 within the signal detection system 100. For example, amplifier 122 may be a class A amplifier, a class B amplifier, a class C amplifier, a class D amplifier, or a class E amplifier. Further, amplifier 122 may operate over different bandwidths depending upon the design goals and operation of the signal detection assembly 102.

With continued reference to the signal detection assembly 102, the spur detector 124, which also may be referred to as signal detector 124, may be coupled with the receiver 114 and the amplifier 122 via link 134, which may be wired or wireless. As will be described in greater detail below, spur detector 124 is configured to detect spurious signals present in the signal of interest after being amplified by the amplifier 122. In one particular embodiment, spur detector 124 is an electronic circuit that executes instructions to detect a leading edge and a trailing edge of a nonlinear amplification event and is operative to generate a time envelope that brackets the nonlinear amplification event from the leading edge to the trailing edge thereof. The spur detector 124 may be any electronic circuit, however, in one particular embodiment, the spur detector 124 is formed from a field programmable gate array (FPGA).

The signal detector or spur detector 124 may be directly or indirectly coupled with the comparator 126 via link 136. In one particular embodiment, comparator 126 includes the tagging circuit 128. However, it is entirely possible that the tagging circuit 128 be a separate and distinct electrical device from the comparator 126. The comparator 126 and the tagging circuit 128 are coupled with the receiver 114 via link 138, which may be wired or wireless. Further, if implemented as an FPGA, the tagging circuit 128 and the comparator 125 may be part of the spur detector 124. Thus, in some exemplary embodiments, there may be a single unified electrical device, such as an FPGA, that accomplishes the functions of the spur detector 124, the comparator 126, and the tagging circuit 128.

The comparator 126 is an electronic circuit or electronic device for use for comparing the time envelope of the signal of interest after it has been amplified with a corresponding time period of the signal of interest at the receiver 114 to determine whether harmonic signals, noise, or other nuisance signals in the time envelope are spurious during the corresponding signal of interest 132. In one particular embodiment, the comparator 126 compares amplitudes of the harmonic, noise, or nuisance signals in the amplified signal against the signal of interest 132 in a corresponding time period as determined by the time envelope of a nonlinear amplification event. The comparator 126 may, in some embodiments, utilize voltages or currents to effectuate the comparison between the signal of interest 132 and the harmonic or nuisance signals present in the time envelope between the leading edge and trailing edge of the nonlinear amplification event.

The tagging circuit 128 may be an electronic device or an electronic circuit that is in operative communication with the comparator 126. When the comparator 126 determines that the harmonic signals or nuisance signals in the amplified signal are spurious, then the tagging circuit is operative to tag these noise or harmonic signals as spurious. In one particular embodiment, the tagging circuit 128 may account for an amplitude threshold value which may be preselected or may be variable depending on the desired functionality of the signal detection system. For example, the amplitude threshold value may be stored in at least one non-transitory computer readable storage medium having instructions encoded thereon that, when executed by one or more processors, that work in conjunction with the comparator 126 and the tagging circuit 128 to enable the tagging circuit 128 to tag some or all of the harmonic signals generated during the nonlinear amplification event within the time envelope as spurious in response to the comparator 126 identifying that the harmonic signals are below a threshold value. The amplitude threshold value may be preselected in order to vary the ratio of harmonic signals that are tagged as spurious. For example, if the threshold value is increased, then there may be more harmonic signals that fail to meet the threshold value and are thus tagged as spurious. However, if the amplitude threshold value is lowered, then more harmonic signals may have an amplitude that exceeds the amplitude threshold value and are not tagged as spurious. An operator or one having ordinary skill in the art, would understand that preselecting or setting the amplitude threshold value is a matter of design implementation.

Comparator 126 may also be an FPGA. When the comparator 126 and the tagging circuit 128 are both implemented as FPGAs, it is possible that a single FPGA can be utilized to accomplish the functionality of the comparator 126 and the tagging circuit 128. Thus, it is to be understood that a tagging circuit 128 and comparator 126 may be a unified device performing dual functions.

The receiver 114 is in operative communication with the processing logic 118 and the downstream hardware device 120. As will be described in greater detail below, the signals output from the receiver 114 may be either sent to the processing logic 118 or directly to the hardware device 120 along link 140 depending on whether the signal was tagged as spurious by the tagging circuit 128. Thus, if the receiver 114 of the signal detection assembly 102 outputs a signal 142 that has been tagged as spurious by the tagging circuit 128, then the tagged signal 142 bypasses the processing logic 118 and travels along link 140 directly to the downstream hardware device. While FIG. 2 indicates that the link 140 may extend through the processing logic 118, it is entirely possible that the bypass of the processing logic 118 does not extend therethrough. Accordingly, it is to be understood that the dashed line configuration of the processing logic 118 represents that the tagged signal 142 extends directly from the receiver 114 to the hardware device 120 without any interruption or processing occurring by the logic 118. As will be described in greater detail below, in the event that the tagging circuit 128 does not tag a signal output from the receiver as spurious, then the untagged signal will travel from the receiver 114 to the processing logic 118. The signal processing logic 118 will operate in a similar manner to that of processing logic 18 in order to perform various analyzations before the processed signal 144 is sent from the processing logic 118 to the downstream hardware device 120.

Figure 3A:
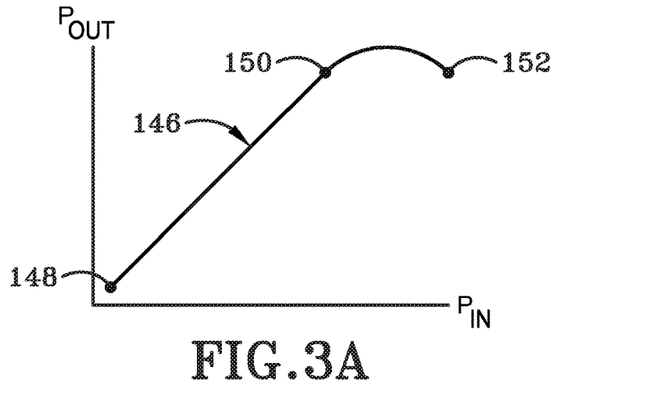
FIG. 3A is a schematic of an amplifier depicting a linear amplification region and a nonlinear amplification region.

FIG. 3A depicts an exemplary amplification curve for the amplifier 122 in receiver 114. The amplification relationship is depicted by line 146 that is straight and linear between a first point 148 and a second point 150. When the power in ($P_{in}$-X axis) exceeds the second point 150, the power out ($P_{out}$-Y axis) represent a portion of the line 146 that becomes curved and nonlinear between the second point 150 and a third point 152. Thus, when the power input of the signal 132 traveling along link 130 exceeds the second point 150, the signal 132 being amplified by the amplifier 122 will enter a nonlinear amplification event.

Figure 3B:
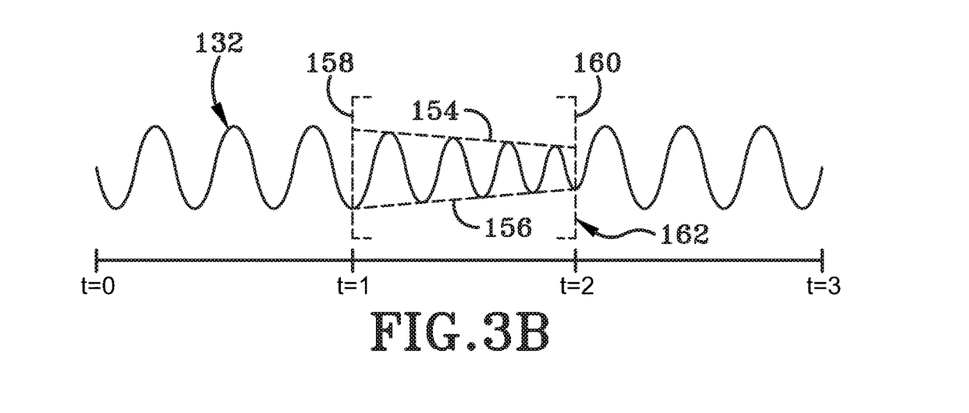
FIG. 3B is a schematic view of a signal having a decreased amplitude during a nonlinear amplification event inside a time envelope defined between a leading edge and a trailing edge.

FIG. 3B depicts a nonlinear amplification event of the signal 132. The X axis of the graph represents a time. From time 0 (t=0) to time 1 (t=1), the signal 132 is operating in the linear region of the power amplification line 146 between its first point 148 and its second point 150. At time 1 (t=1), the power in for the amplification exceeds the second point 150 and the signal 132 enters an nonlinear amplification event until time 2. From time 2 (t=2) to time 3 (t=3), the signal 132 has a power that is reduced and is between the first point 148 and the second point 150 such that the signal 132 is experiencing a traditional linear power amplification. During the nonlinear amplification event between time 1 (t=1) and time 2 (t=2), the upper amplitude 154 and the lower amplitude 156 are brought closer together so as to reduce the overall amplitude of the signal 132 between the leading edge 158 and trailing edge 160 of the nonlinear amplification event. The bracketed time of the nonlinear amplification event from time 1 (t=1) to time 2 (t=2), as determined by the leading edge 158 and the trailing edge 160, collectively define a time envelope 162. The time envelope 162, as will be described in greater below, is used by the comparator 126 to determine whether the tagging circuit 128 should tag the signal as spurious during this time. Then, if the tagging circuit 128 determines that this is spurious, then the spurious tagged signal 142 bypasses the processing logic 118 and travels directly from the receiver 114 along link 140 to hardware device 120.

Figure 3C:
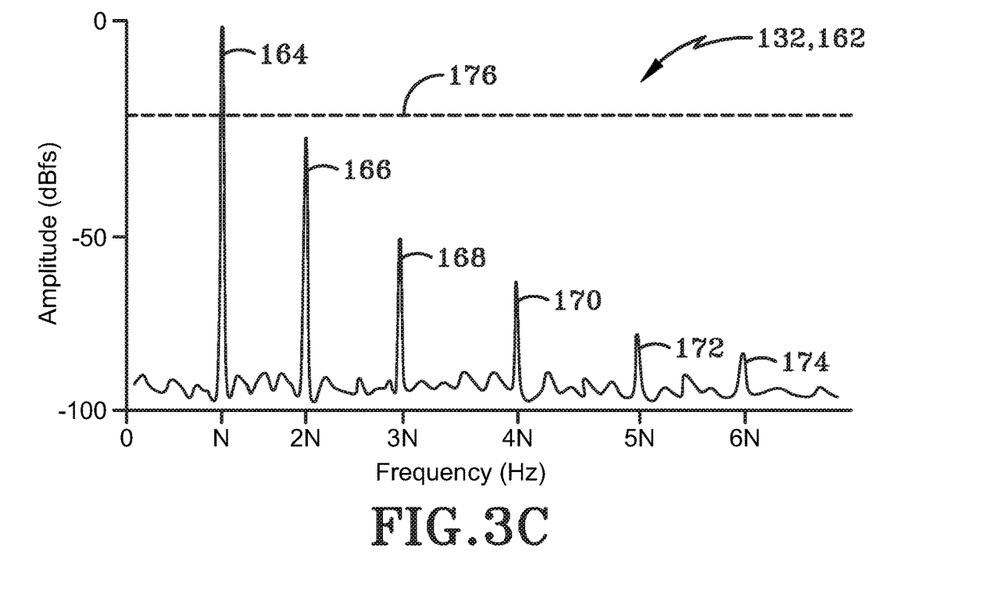
FIG. 3C is a schematic view of orders of harmonic signals falling below an amplitude threshold during the nonlinear amplification event.

FIG. 3C depicts the signal 132 during the time envelope 162. The signal of interest during the time envelope 162 depicts a first portion 164 of the signal 132, which represents the signal of interest portion of the signal 132 inasmuch as it has the greatest amplitude. A second portion 166 represents a harmonic order N, such as a first harmonic order, that incidentally occurs in response to the signal 132 being amplified in a nonlinear manner. As mentioned above, harmonic signals or other noise is generated when a signal, such as signal 132, is amplified during a nonlinear amplification event. Thus, the second portion 166, together with third portion 168, fourth portion 170, fifth portion 172, and sixth portion 174 represent harmonic orders of the signal 132. However, the signal of interest is carried within the first portion 164 and the harmonic orders identified by the respective portions 166, 168, 170, 172, and 174 of the signal 132 are noise portions that should be tagged as spurious by the tagging circuit because they fall below an amplitude threshold 176.

Figure 4:
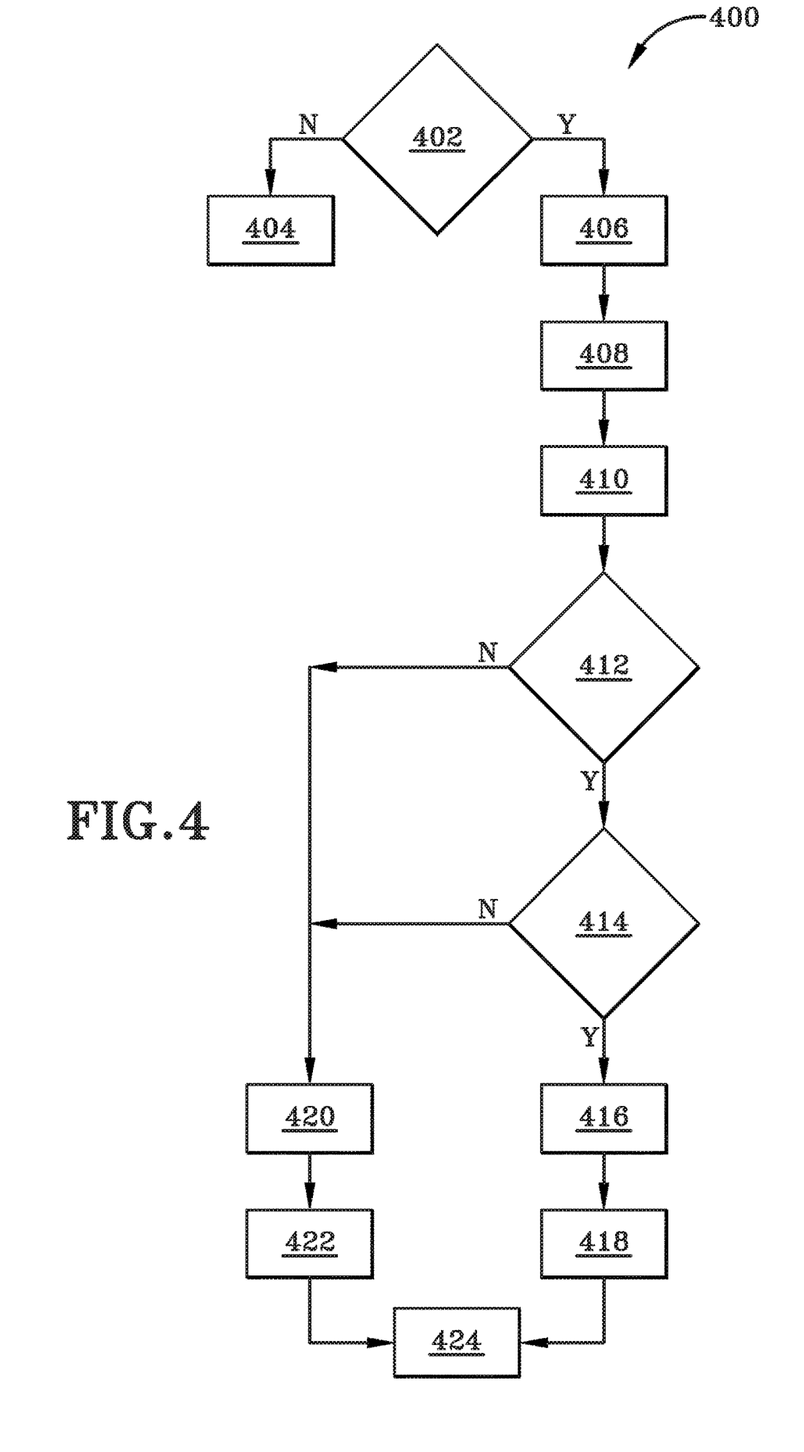
FIG. 4 is a flowchart in accordance with an exemplary method or process in accordance with one aspect or embodiment of the present disclosure.

FIG. 4 depicts an exemplary method or process of determining and detecting whether a signal is spurious and rejecting the same generally at 400. Method 400 includes determining by the spur detector 124 whether the receiver 114 is driven into a nonlinear operating region of an amplification event by the amplifier 122. If no (N), then the detector does not engage or begin evaluation and a signal proceeds through the receiver 114 in a conventional manner to process by the signal processing logic 118 and the downstream hardware device 120. If at 402 the signal detector determines that yes (Y), the amplifier 122 has driven the signal into a nonlinear amplification event, then the signal detector or spur detector 124 determines the leading edge 158 and the trailing edge 160 in the nonlinear event, which is shown generally at 406. The spur detector 124 may also determine the time (t=1) associated with the leading edge 158 and the time (t=2) associated with the trailing edge 160 to generate the time envelope 162 within which the signal 132 is operating in a nonlinear amplification event, which is shown generally at 408. The spur detector 124 then transmits along link 136 the time envelope 162 for the signal 132 to the comparator 126 and the tagging circuit 128, which is shown generally at 410. The comparator 126 compares the time envelope 162, and particularly the leading edge 158 and the trailing edge 160 thereof, with the signal 132 as it was received at the amplifier 122 in the receiver 114. The comparator 126 may perform a time alignment process in the event that the time envelope align with the signal 132 as it was received by the receiver 114. After the time alignment, the comparison in the comparator 126 determines that the comparison is not match (N), then the signal is not tagged as spurious, which is shown generally at 420. If the comparator 126 at 412 does determine a match between the time envelope 162 and the signal 132 at the amplifier 122 of receiver 114 (Y), then the harmonic portions of the signal are determined whether they fall below an amplitude threshold 176. If at 414 the amplitude of the other portions of the signal exceed the amplitude threshold, then they are not tagged as spurious by the tagging circuit 128 and follow the path to 420 (N). Signals that are not tagged as spurious, which are shown generally at 420, are transmitted to the downstream signal processing logic 118, which is generally shown at 422. After the signal processing logic 118 processes the signal that has not been tagged as spurious, then the non-tagged signals may be sent to the downstream hardware device 120, which is shown generally at 424.

Referring back to the determination of whether the harmonic portions of the signal of interest are below the amplitude threshold, which is shown generally at 414, if the amplitudes of the harmonic portions of the signal of interest during the nonlinear amplification event fail to meet the amplitude threshold 176 (Y), then the tagging circuit 128 tags these signals in this portion of the time envelope 162 as spurious, which is shown generally at 416. When these signals are tagged as spurious, then the receiver 114 sends these spurious tagged signals 142 along link 140 directly from the receiver 114 to the downstream hardware device 120 bypassing any signal processing logic 118, which is shown generally at 418. The bypassing of the signal processing 118, which is shown generally at 418, then enables the signal to be sent directly to the downstream hardware device at 424.

Having thus described some general aspects of the present disclosure relate to the signal detection system 100, the detection assembly 102, and its accompanying method 400, reference will be made towards some additional exemplary features of the present disclosure.

In electrical systems and electrical networks that have a receiver, such as receiver 114, a signal usually encounters radio frequency (RF) electronics. When a signal, such as signal 132, is sent through the RF electronics, such as an RF amplifier 122, nonlinear properties of the RF amplifier or RF device are imparted to the signal. Nonlinear properties result in an offending signal that is driving the RF amplifier hard enough to start to have noticeable nonlinearities. The nonlinearities show up as signals at harmonic frequencies, such as portions 166, 168, 170, 172, or 174 in FIG. 3C. The stronger the incoming signal results in larger harmonics. The harmonics come through the receiver 114 and when observing the output of the receiver, at the frequency of interest, the harmonic frequencies may be falsely detected or observed, and create false alarm signals or false positives of the signal of interest. Stated otherwise, when a harmonic signal comes through and is output from the receiver at a given frequency that is not intended to be output from the receiver, it creates a nuisance report of the signal. The harmonic signals are nuisance signals that are false positives to the downstream devices.

In one exemplary solution, the present disclosure eliminates or significantly reduces the likelihood of the nuisance signals such that they no longer have to be processed by the downstream processing logic 118. Stated otherwise, the system of the present disclosure desires to eliminate or reduce the likelihood that the RF amplifier 122 and the receiver 114 from being informed that there is a signal of interest when it is actually a nuisance signal created by nonlinear amplification. As stated previously, these nuisance signals are a result of the harmonics at a frequency that is similar to that of the signal of interest that are nuisance harmonic artifacts/signals that need to be ignored. Collectively, these are referred to as spurious signals.

In one particular embodiment, the system 100 of the present disclosure eliminates spurious signals that are a result of total harmonic distortion. When there is a signal of interest (i.e., signal 132) at a given frequency that is transmitted through the RF amplifier 122, the amplifier 122 causes a distortion to the signal of interest. The distortion of the waveform of the signal results in frequency content other than the frequency of interest (i.e., spurious signals). Thus, the other frequencies are distortion products that are harmonic with the signal of interest (i.e., portions 166, 168, 170, 172, or 174 in FIG. 3C).

One having ordinary skill in the art understands that one exemplary perfect wave incoming to the receiver is a sinusoidal wave. Any deviation from being a perfect sinusoidal wave manifests itself as a harmonic distortion. The harmonic distortion refers to energy that is created in the waveform that is at first, second, third, fourth, fifth, or more harmonics (i.e., portions 166, 168, 170, 172, or 174 in FIG. 3C). Typically, the largest harmonics are first order, second order, third order, or fourth order; however, there may be others. For example, as depicted in FIG. 3C, the signal of interest is depicted at an exemplary X-axis arbitrary value of N. At the X-axis arbitrary value of 2N, there will be a first order signal (i.e., portion 166) of the harmonic that is at a slightly lower amplitude. At the X-axis arbitrary value of 3N, there will be a second harmonic signal (i.e., portion 168) that is slightly lower than the first order harmonic signal (i.e., portion 166). While not shown in FIG. 3C, in other situations, some of the amplitudes of the first and second order harmonic signals might be great enough (i.e., above a threshold 176) that they will appear to be signals of interest to the downstream hardware devices 120 that are receiving the signal of interest from the receiver.

If the duration of the nonlinear event occurring in the RF amplifier 122 is of a sufficient time, then the duration of the harmonic event is that same amount of time. Thus, the system 100 of the present disclosure exploits a similar timeframe or time envelope 162 of the signal of the interest and the harmonics created in response to a nonlinear event in the RF amplifier to evaluate the harmonic or spurious signals so that they may be tagged, by tagging circuit 128, as a spurious event. The tagged signals 142 bypass the downstream processing logic 118 and proceed directly along link 140 to the downstream hardware device 120 positioned downstream from the processing logic 118. The present disclosure tags these spurious signals based on their time interval that brackets (i.e., time envelope 162) the spurious signal interval and matches the same through a time alignment process. The system 100 provides this time information to the downstream hardware device 120 so it may ignore the signal during that time envelope 162. However, prior to sending the time envelope 162 to the downstream hardware device, the tagging circuit 128 determines whether the amplitude of the spurious signals meets, exceeds, or is less than a threshold value 176 so the system can then determine whether or not it is the signal of interest or the spurious signal itself.

Spurious signals have an amplitude that are less than the signal of interest; however, it is possible that the spurious signals still has an amplitude that is sufficiently high such that the downstream devices believe or consider the spurious signal to be a signal of interest. Thus, the present disclosure attempts to eliminate these false positive signals of interest which are actually spurious signals.

In electronic warfare (EW) systems, RF amplifiers and their corresponding receivers receive signals of interest that are subject to environmental conditions. The receiver 114 and RF amplifier 122 in an EW system observes the signal and it cannot move into a more efficient range based on its observational requirements. Accordingly, the system of the present disclosure is configured to eliminate spurious signals that are generated in response to RF amplification of a signal of interest in an EW system on a platform, which may be any manned or unmanned vehicle.

The system 100 of the present disclosure shifts some of the burden of signal processing to the firmware and hardware in the receiver, namely, the tagging circuit 128, and removes this responsibility from the downstream signal processing 118 logic which typically occurs by software. The system 100 of the present disclosure reduces software loading in the downstream signal processing logic 118 to enable the downstream software signal processing logic to have greater software processing abilities for other more important aspects of the EW system without significantly increasing size, weight, power, or cost to existing legacy EW systems.

In operation, an exemplary method in accordance with the present disclosure determines, with the spur detector 124, whether the receiver 114 is driven into the nonlinear operating region by the RF amplifier 122. If the assembly 102 determines that the signal is not in a nonlinear region (i.e., it remains in a linear region), then the signal continues processing through the downstream processing logic 118 and there is no tagging of any signals. In some instances, the signal of interest will be the only signal that exists during the linear amplification regions. Thus, the assembly 102 determines whether the nonlinear RF amplification region is entered in order to identify how much power at which the harmonic or spurious signal is going to become high enough in amplitude that it will cross into a detectable region and thus need to be tagged as spurious so as to not interfere with the downstream hardware device 120. The detectable region is system 100 dependent and may be slightly less than the amplitude of the signal of interest or may be greatly less than the signal of interest depending upon the application or implementation of the system within which the present disclosure is utilized.

After determining that the signal of interest has entered a nonlinear amplification phase, then the detector determines a leading edge time and a trailing edge time of the nonlinear event to create a time envelope that brackets the signal starting from the leading edge of the event to the trailing edge of the event. Stated otherwise, the time envelope is a bracket that extends from the leading edge to the trailing edge. With the time envelope or the bracket of time from the leading edge to the trailing edge, the pulse is considered a bracketed pulse that is aligned with the detecting circuit (i.e., the spur detector 124) in time. The bracketed time envelope from the detecting circuit is brought into the receiver and is responsible for detecting all of the signals. There the bracketed signal is time aligned with the signals received by the receiver.

In one non-limiting example, the time alignment process is accomplished by determining an amount of time required to make a decision to bracket the time envelope between the leading edge to the trailing edge of the nonlinear event. Energy causing the nonlinear event is typically followed sometime later by a bracket of the event itself. For example, there may be a ten microsecond event that causes the nonlinearity in the RF amplifier 122. If two microseconds after the end of the ten microsecond nonlinear event is output from the detecting circuit (i.e., spur detector 124) as the leading edge of the time envelope condition, it is considered to be lagging the energy by two microseconds. The receiver 114 is observing the environment in a more detailed manner than the spur detector 124. If it takes the receiver 114 three microseconds to see the same signal then it will create a nonlinear event having a leading edge and a trailing edge the lags the energy by three microseconds. Then, there is a two microsecond lag event at the spur detector 124 and a three microsecond lag event at the receiver 114. The lag event in the spur detector 124 needs to be delayed by one microsecond to align and correspond with the three microsecond nonlinear event in the receiver 114. Then, when both events are three microsecond lagged nonlinear events, they are considered to be time aligned. When they are time aligned, the assembly 102 determines how close together the leading edge and the trailing edge are between the spur detection event in the spur detector 124 and the signal detection event in the receiver 114.

The tagging circuit compares the leading edges and trailing edges of the nonlinear event from the detecting circuit (i.e., spur detector) and the receiver. When the tagging circuit compares the time aligned nonlinear events from the spur detector and the receiver, it they are different, then the tagging signal does not tag the nonlinear event as spurious. If the comparison determines that the leading and trailing edges are the same, then the determination proceeds to determine whether the nonlinear event resulted in or generated spurious signals based, at least partially, on amplitude of harmonic signals. Stated otherwise, it the leading edge and the trailing edge between the spur detector and the receiver line up in time and if the amplitude of the harmonic signal is below a threshold Y, then the signal is considered spurious and it is removed, discarded, or otherwise ignored. If the amplitude exceeds the threshold, then the signal is not tagged as spurious and may continue to be processed by the downstream signal processing logic. The downstream signal processing is accomplished by software logic.

In accordance with one exemplary aspect of the present disclosure, the system improves throughput of excess signals that are not needed compared to the conventional signal processing techniques identified in FIG. 1. Further, by eliminating the spurious signals as detailed herein, the system of the present disclosure is able to reduce the number of false alarm signal events over the systems identified in FIG. 1. Thus, the system of the present disclosure reduces false alarms and reduces false reporting, which is beneficial in EW systems.

In accordance with another exemplary aspect, there may be a first frequency band detection range associated with the of the spur detector 124, and a second frequency band detection range associated with the receiver 114, wherein the first frequency band detection range is greater than the second frequency band detection range. Stated otherwise, when the spur detector 124 is fabricated as a FPGA, the spur detector 124 is formed at a broader band level than the detection of the receiver 114. Thus, the spur detector 124, when embodied as an FPGA, observes the entire band of interest. The FPGA spur detector 124 is able to look at the entire band of interest simultaneously. The spur detection may be accomplished by the FPGA when implemented with spur detection code as implemented by the FPGA. The FPGA spur detection code mimics the approach of a high sensitivity receiver. In one particular embodiment, this is beneficial to the operation of the system inasmuch as previous threshold detectors would essentially create a spurious or nonlinear event based on threshold only. The FPGA and its spur detection code does not perform this way because it determines a threshold crossing and then attempts to find a leading edge and a trailing edge using the same principles of the high sensitivity receiver by processing the likelihood of being able to align the events precisely is greater. When evaluating only the threshold crossing, the time envelope is not accurate. Thus, evaluating the leading edge and the trailing edge of the nonlinear event embodies an improved approach to solving the spurious signal detection problem. Stated otherwise, the present disclosure determines half voltage crossings on the leading edge and the trailing edge of the signal. Alternatively to half voltage crossing or processing, half power crossing or processing may be utilized. However, half power processing would require additional computational requirements.

Various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, embodiments of technology disclosed herein may be implemented using hardware, software, or a combination thereof. When implemented in software, the software code or instructions can be executed on any suitable processor or collection of processors, whether provided in a single computer or distributed among multiple computers. Furthermore, the instructions or software code can be stored in at least one non-transitory computer readable storage medium.

Also, a computer or smartphone utilized to execute the software code or instructions via its processors may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers or smartphones may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes outlined herein may be coded as software/instructions that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, USB flash drives, SD cards, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the disclosure discussed above. The computer readable medium or media can be transportable, such that the program or programs stored thereon can be loaded onto one or more different computers or other processors to implement various aspects of the present disclosure as discussed above.

The terms "program" or "software" or "instructions" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present disclosure need not reside on a single computer or processor, but may be distributed in a modular fashion amongst a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

All definitions, as defined and used herein, should be understood to control over dictionary definitions, definitions in documents incorporated by reference, and/or ordinary meanings of the defined terms.

"Logic", as used herein, includes but is not limited to hardware, firmware, software and/or combinations of each to perform a function(s) or an action(s), and/or to cause a function or action from another logic, method, and/or system. For example, based on a desired application or needs, logic may include a software controlled microprocessor, discrete logic like a processor (e.g., microprocessor), an application specific integrated circuit (ASIC), a programmed logic device, a memory device containing instructions, an electric device having a memory, or the like. Logic may include one or more gates, combinations of gates, or other circuit components. Logic may also be fully embodied as software. Where multiple logics are described, it may be possible to incorporate the multiple logics into one physical logic. Similarly, where a single logic is described, it may be possible to distribute that single logic between multiple physical logics.

Furthermore, the logic(s) presented herein for accomplishing various methods of this system may be directed towards improvements in existing computer-centric or internet-centric technology that may not have previous analog versions. The logic(s) may provide specific functionality directly related to structure that addresses and resolves some problems identified herein. The logic(s) may also provide significantly more advantages to solve these problems by providing an exemplary inventive concept as specific logic structure and concordant functionality of the method and system. Furthermore, the logic(s) may also provide specific computer implemented rules that improve on existing technological processes. The logic(s) provided herein extends beyond merely gathering data, analyzing the information, and displaying the results. Further, portions or all of the present disclosure may rely on underlying equations that are derived from the specific arrangement of the equipment or components as recited herein. Thus, portions of the present disclosure as it relates to the specific arrangement of the components are not directed to abstract ideas. Furthermore, the present disclosure and the appended claims present teachings that involve more than performance of well-understood, routine, and conventional activities previously known to the industry. In some of the method or process of the present disclosure, which may incorporate some aspects of natural phenomenon, the process or method steps are additional features that are new and useful.

The articles "a" and "an," as used herein in the specification and in the claims, unless clearly indicated to the contrary, should be understood to mean "at least one." The phrase "and/or," as used herein in the specification and in the claims (if at all), should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc. As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

When a feature or element is herein referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "connected", "attached" or "coupled" to another feature or element, it can be directly connected, attached or coupled to the other feature or element or intervening features or elements may be present. In contrast, when a feature or element is referred to as being "directly connected", "directly attached" or "directly coupled" to another feature or element, there are no intervening features or elements present. Although described or shown with respect to one embodiment, the features and elements so described or shown can apply to other embodiments. It will also be appreciated by those of skill in the art that references to a structure or feature that is disposed "adjacent" another feature may have portions that overlap or underlie the adjacent feature.

Spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Similarly, the terms "upwardly", "downwardly", "vertical", "horizontal", "lateral" and the like are used herein for the purpose of explanation only unless specifically indicated otherwise.

Although the terms "first" and "second" may be used herein to describe various features/elements, these features/elements should not be limited by these terms, unless the context indicates otherwise. These terms may be used to distinguish one feature/element from another feature/element. Thus, a first feature/element discussed herein could be termed a second feature/element, and similarly, a second feature/element discussed herein could be termed a first feature/element without departing from the teachings of the present invention.

An embodiment is an implementation or example of the present disclosure. Reference in the specification to "an embodiment," "one embodiment," "some embodiments," "one particular embodiment," "an exemplary embodiment," or "other embodiments," or the like, means that a particular feature, structure, or characteristic described in connection with the embodiments is included in at least some embodiments, but not necessarily all embodiments, of the invention. The various appearances "an embodiment," "one embodiment," "some embodiments," "one particular embodiment," "an exemplary embodiment," or "other embodiments," or the like, are not necessarily all referring to the same embodiments.

If this specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

As used herein in the specification and claims, including as used in the examples and unless otherwise expressly specified, all numbers may be read as if prefaced by the word "about" or "approximately," even if the term does not expressly appear. The phrase "about" or "approximately" may be used when describing magnitude and/or position to indicate that the value and/or position described is within a reasonable expected range of values and/or positions. For example, a numeric value may have a value that is +/−0.1% of the stated value (or range of values), +/−1% of the stated value (or range of values), +/−2% of the stated value (or range of values), +/−5% of the stated value (or range of values), +/−10% of the stated value (or range of values), etc. Any numerical range recited herein is intended to include all sub-ranges subsumed therein.

Additionally, the method of performing the present disclosure may occur in a sequence different than those described herein. Accordingly, no sequence of the method should be read as a limitation unless explicitly stated. It is recognizable that performing some of the steps of the method in a different order could achieve a similar result.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of various embodiments of the disclosure are examples and the disclosure is not limited to the exact details shown or described.

The invention claimed is:

1. A method comprising:
    determining, by a spurious signal (spur) detector, whether a signal amplified by an amplifier drives the amplifier into a nonlinear operating region during an amplification event;
    wherein if the amplifier is in a linear operating region of the amplification event, then processing the signal in signal processing logic and providing the signal to a downstream hardware device;
    wherein if the amplifier is in the nonlinear operating region of the amplification event, then:
    defining a time envelope from a leading edge to a trailing edge of a nonlinear amplification event;
    determining the time of the leading edge and the trailing edge of the time envelope;
    comparing, in a comparator, the time envelope with the signal as received by a receiver coupled to the spur signal detector for a corresponding time period as the time envelope;
    tagging, with a tagging circuit coupled to the comparator, the signal as a spurious tagged signal in response to the time envelope matching the signal received by the receiver with the time envelope; and
    bypassing the signal processing logic and transmitting the signal tagged as spurious directly to a downstream hardware device.

2. The method of claim 1, further comprising:
    time aligning the time envelope with the signal as received by the receiver prior to comparing the time envelope with the signal.

3. The method of claim 1, further comprising:
    identifying harmonic noise during the nonlinear amplification event;
    determining an amplitude associated with the harmonic noise relative to an amplitude threshold, wherein if the amplitude exceeds the amplitude threshold, then processing the signal in signal processing logic and providing the signal to the downstream hardware device; and
    wherein if the amplitude fails to meet the amplitude threshold, then tagging the signal as spurious and bypassing the signal processing logic.

4. The method of claim 1, further comprising:
    receiving the signal subject to environmental conditions that operatively reduce an ability of an electronic warfare (EW) system from moving into a more efficient operating range, and wherein the spur detector, the comparator, and the tagging circuit are adapted to reduce processing of spurious signals when the EW system cannot move into a more efficient operating range based on observational requirements of the EW system.

5. The method of claim 1, further comprising:
    increasing signal throughput, in the signal processing logic, by bypassing the signals tagged as spurious directly to the downstream hardware device.

6. The method of claim 5, further comprising:
    reducing false positives in the signal as observed by the downstream hardware device.

7. The method of claim 1, further comprising:
    reducing software loading in the signal processing logic to enable the signal processing logic to have greater software processing abilities for other aspects of an electronic warfare (EW) system.

8. A system comprising:
    a signal source generating a signal of interest;
    a receiver in operative communication with the signal source to receive the signal of interest, wherein the signal effectuates a receiver operation;
    an amplifier in the receiver to amplify the signal of interest and incidentally generate harmonic signals in response to the amplifier being driven into at least one nonlinear amplification event of the signal of interest, wherein each nonlinear event includes a leading edge and a trailing edge;
    a spurious signal (spur) detector in operative communication with the receiver and the amplifier to detect the leading edge and the trailing edge of the nonlinear amplification event and operative to generate a time envelope that brackets the nonlinear amplification event from the leading edge to the trailing edge;
    a comparator in operative communication with the spur detector that compares the time envelope with the signal of interest in a corresponding time period to determine whether harmonic signals in the time envelope are spurious during the corresponding signal of interest based on an amplitude threshold;
    a tagging circuit coupled to the comparator that is operative to tag the nonlinear amplification events as spurious in response to the a determination of the harmonic signals relative to the threshold value;
    signal processing logic downstream from the receiver;
    a hardware device downstream from the signal processing logic;
    wherein if the tagging circuit tags the nonlinear amplification events as spurious, then the signal of interest bypasses the signal processing logic and is directed directly from the receiver to the hardware device; and
    wherein if the tagging circuit does not tag an amplification event as spurious, then the signal of interest is directed from the receiver to the signal processing logic for further processing.

9. The system of claim 8, further comprising:
    the signal having linear amplification events in addition to the nonlinear amplification events, wherein the leading edge of the nonlinear amplification event begins at an end of one linear amplification event.

10. The system of claim 9, wherein the linear amplification events represent non-spurious signal periods.

11. The system of claim 8, further comprising:
    a direct connection between the receiver and the hardware device effectuating the signal to bypass the signal processing logic when the tagging circuit tags the nonlinear events in the signal.

12. The system of claim 8, that is free of a program that generates a pulse report identifying tagged spurious signals to be processed by the signal processing logic.

13. The system of claim 8, wherein the tagging circuit is part of the spur detector.

14. The system of claim 8, wherein the tagging circuit is distinct from the spur detector.

15. A spurious signal detection assembly comprising:
    a receiver having a radio frequency (RF) amplifier operative to receive a signal of interest;

a spurious signal (spur) detector in operative communication with the receiver operative to detect nonlinear amplification events of the signal of interest, wherein the RF amplifier generates harmonic signals during a nonlinear amplification event;

a time envelope that extends from a leading edge of the nonlinear amplification event to a trailing edge of the nonlinear amplification event;

a comparator to compare the time envelope with a corresponding time period of the signal of interest received by the receiver;

a tagging circuit operative to tag the harmonic signals during nonlinear amplification events as a spurious signal; and wherein if the tagging circuit tags the harmonic signal as the spurious signal, then the spurious signal bypasses downstream signal processing logic, and if the tagging circuit does not tag the harmonic signal as the spurious signal, then the downstream signal processing logic processes the signal of interest within the time envelope.

16. The spurious signal detection assembly of claim 15, further comprising:

an amplitude threshold in the comparator that determines whether the harmonic signals are below the amplitude threshold.

17. The spurious signal detection assembly of claim 15, wherein the spur detector is a field programmable gate array (FPGA).

18. The spurious signal detection assembly of claim 17, further comprising:

a first frequency band detection range associated with the of the spur detector; and a second frequency band detection range associated with the receiver; wherein the first frequency band detection range is greater than the second frequency band detection range, wherein the first frequency band detection range is an entire band of interest that is accomplished by the FPGA with spur detection code.

19. The spurious signal detection assembly of claim 18, wherein the spur detection code mimics a detection approach of a high sensitivity receiver through time alignment of the time envelope from the spur detector with the corresponding time period of the signal of interest in the receiver.

20. The spurious signal detection assembly of claim 19, wherein the spur detection code detects half voltage crossings of the leading edge and the trailing edge of the signal of interest.

* * * * *